US008692617B2

(12) United States Patent
Broyde et al.

(10) Patent No.: US 8,692,617 B2
(45) Date of Patent: Apr. 8, 2014

(54) BALANCED-INPUT CURRENT-SENSING DIFFERENTIAL AMPLIFIER

(71) Applicant: Tekcem, Maule (FR)

(72) Inventors: Frederic Broyde, Maule (FR); Evelyne Clavelier, Maule (FR)

(73) Assignee: Tekcem, Maule (FR)

( * ) Notice: Subject to any disclaimer, the term of this patent is extended or adjusted under 35 U.S.C. 154(b) by 0 days.

(21) Appl. No.: 13/692,193

(22) Filed: Dec. 3, 2012

(65) Prior Publication Data

US 2013/0093518 A1 Apr. 18, 2013

Related U.S. Application Data

(63) Continuation of application No. PCT/IB2011/052213, filed on May 20, 2011.

(30) Foreign Application Priority Data

Jun. 25, 2010 (FR) ...................................... 10 02662

(51) Int. Cl.
H03F 3/45 (2006.01)
(52) U.S. Cl.
CPC ........................................ H03F 3/45 (2013.01)
USPC ........................................ 330/257; 330/288
(58) Field of Classification Search
CPC ........................................................ H03F 3/45
USPC ........................... 330/257, 288, 253; 327/359
See application file for complete search history.

(56) References Cited

U.S. PATENT DOCUMENTS

| 5,132,640 A | 7/1992 | Tanaka et al. |
| 5,483,194 A * | 1/1996 | Genest ............................ 330/253 |
| 5,986,501 A | 11/1999 | Rafati et al. |
| 6,291,977 B1 * | 9/2001 | Iliasevitch ..................... 323/315 |
| 7,471,110 B2 | 12/2008 | Dixit et al. |
| 2007/0099564 A1 | 5/2007 | Dixit et al. |

OTHER PUBLICATIONS

Seevinck, "Design and Application of Integrated Analog Interface Circuits", pp. 1923-1926, (1988).
Ishibe et al.; High-Speed CMOS I/O Buffer Circuits; IEEE Journal of Solid-State Circuits; Apr. 1992; pp. 671-673; vol. 27, No. 4.
Seevinck E.; Design and application of integrated analog interface circuits; Peter Peregrinus Ltd.; XP010069290; Jun. 7, 1988; pp. 1923-1926.

(Continued)

Primary Examiner — Robert Pascal
Assistant Examiner — Khiem Nguyen
(74) Attorney, Agent, or Firm — Barnes & Thornburg LLP

(57) ABSTRACT

A current-sensing differential amplifier has a balanced input. Thus, a balanced-input current-sensing differential amplifier has a first signal input terminal, a second signal input terminal, a first signal output terminal and a second signal output terminal. The balanced-input current-sensing differential amplifier includes a first current mirror, the input terminal of the first current mirror being coupled to the first signal input terminal, a second current mirror, the input terminal of the second current mirror being coupled to the second signal input terminal, a third current mirror, one of the output terminals of the third current mirror being coupled to the common terminal of the first current mirror and to the common terminal of the second current mirror, three current sources and an output circuit.

12 Claims, 8 Drawing Sheets

(56) References Cited

OTHER PUBLICATIONS

Zhang et al.; Differential Current-Mode Signaling for Robust and Power Efficient On-Chip Global Interconnects; Proceedings of the IEEE 14th Topical Meeting on Electrical Performance of Electronic Packaging; EPEP 2005; Oct. 2005; pp. 315-318.

Search Report for International Patent Application No. PCT/IB2011/052213; Sep. 20, 2011.

* cited by examiner

*PRIOR ART*

*PRIOR ART*

BALANCED-INPUT CURRENT-SENSING DIFFERENTIAL AMPLIFIER

CROSS REFERENCE TO RELATED APPLICATIONS

This is a Continuation Application of PCT application PCT/IB2011/052213, filed 20 May 2011, published in English under No. WO 2011/161563, which in turn claims priority to French patent application No. 10/02662 filed 25 Jun. 2010 and entitled "Amplificateur différentiel captant le courant à entrée équilibrée", both of which are incorporated herein by reference.

FIELD OF THE INVENTION

The invention relates to a current-sensing differential amplifier having a balanced input, such current-sensing differential amplifiers being for instance used as the input circuit of differential line receivers for electrical links used for transmitting analog or digital signals.

PRIOR ART

A differential amplifier has two signal input terminals. An output variable (voltage or current) of a current-sensing differential amplifier is mainly determined by the difference of the currents flowing into said signal input terminals, or equivalently by the differential-mode input current flowing through the signal input terminals, denoted by $i_{DM}$. A differential amplifier has a balanced input if and only if the behavior of the input is substantially invariant when the signal input terminals are permuted. For small signals, the input admittance matrix, with respect to ground, of a differential amplifier, denoted by $Y_I$, is a 2×2 matrix. In the case of a balanced-input differential amplifier, $Y_I$ is invariant when the signal input terminals are permuted, so that $Y_I$ is given by $$Y_I = \begin{pmatrix} y_{I11} & y_{I12} \\ y_{I12} & y_{I11} \end{pmatrix} \quad (1)$$

If a differential-mode input voltage, denoted by $v_{DM}$, is applied to the signal input terminals, the differential-mode input current $i_{DM}$ flowing through the signal input terminals is such that $$\begin{pmatrix} i_{DM} \\ -i_{DM} \end{pmatrix} = \begin{pmatrix} y_{I11} & y_{I12} \\ y_{I12} & y_{I11} \end{pmatrix} \begin{pmatrix} v_{DM}/2 \\ -v_{DM}/2 \end{pmatrix} \quad (2)$$

Thus, the differential-mode input impedance, denoted by $z_{DM}$, is given by $$z_{DM} = \frac{v_{DM}}{i_{DM}} = \frac{2}{y_{I11} - y_{I12}} \quad (3)$$

If a common-mode input voltage, denoted by $v_{CM}$, is applied to the signal input terminals, the common-mode input current $i_{CM}$ flowing into the signal input terminals is such that $$\begin{pmatrix} i_{CM}/2 \\ i_{CM}/2 \end{pmatrix} = \begin{pmatrix} y_{I11} & y_{I12} \\ y_{I12} & y_{I11} \end{pmatrix} \begin{pmatrix} v_{CM} \\ v_{CM} \end{pmatrix} \quad (4)$$

Thus, the common-mode input admittance, denoted by $y_{CM}$, is given by $$y_{CM} = \frac{i_{CM}}{v_{CM}} = 2(y_{I11} + y_{I12}) \quad (5)$$

In FIG. 1, a first example of balanced-input current-sensing differential amplifier (1) has two signal input terminals (21) (22) and one signal output terminal (31) for delivering a single-ended output signal. In FIG. 2, a second example of balanced-input current-sensing differential amplifier (1) has two signal input terminals (21) (22) and two signal output terminals (31) (32) for delivering a differential output signal. In FIG. 1 and FIG. 2, the ground terminal and the power supply terminal(s) of the balanced-input current-sensing differential amplifier are not shown.

In the article of L. Zhang, J. Wilson, R. Bashirullah and P. Franzon entitled "Differential Current-Mode Signaling for Robust and Power Efficient On-Chip Global Interconnects", published in the *Proceedings of the IEEE 14th Topical Meeting on Electrical Performance of Electronic Packaging, EPEP* 2005, October 2005, at the pages 315 to 318, a receiver for a differential current-mode signaling scheme uses "current mode sensing". In this receiver, a small voltage is built on a sense resistor, referred to as "bridge resistor", connected to the two signal input terminals. This voltage is sensed by a conventional voltage-sensing differential amplifier. Typically, line receivers for links using low-voltage differential signaling (LVDS) or current-mode logic (CML) comprise this type of balanced-input current-sensing differential amplifier, which presents a low differential-mode input impedance and a low common-mode input admittance.

In the context of high-speed links, this type of balanced-input current-sensing differential amplifier has two major shortcomings:
the voltage-sensing differential amplifier must sense a small voltage across a resistor, so that a substantial noise is present at the output of this amplifier;
the "output variable versus differential-mode input current" characteristic is not well controlled because no global feedback can be used in the voltage-sensing differential amplifier, so that this characteristic depends on manufacturing process variations and on temperature, and has a poor linearity (for large signals).

In the differential current-mode input circuit presented in the article of M. Ishibe, S. Otaka, J. Takeda, S. Tanaka, Y. Toyoshima, S. Takatsuka and S. Shimizu entitled "High-Speed I/O Buffer Circuits", published in the *IEEE Journal of Solid-State Circuits*, Vol. 27, No. 4, April 1992, at the pages 671 to 673, each signal input terminal is connected to the sources of complementary transistors each used in a common-gate configuration. This type of balanced-input current-sensing differential amplifier has a good linearity but it has the drawback of presenting a high common-mode input admittance, so that a common-mode current, which usually corresponds to disturbances caused by nearby circuits, can flow through the input.

Differential current-mode input circuits may also comprise current mirrors. In the present patent application, "current mirror" always refers to a current mirror comprising two or more transistors of any type (bipolar transistor, field effect transistor, etc), providing an output current essentially proportional to the input current over a wide range of input current, and providing a low input impedance for small signals. Such current mirrors are explained in the chapters 2, 6, 7 and 8 of the book of C. Toumazou, F. J. Lidgey and D. G. Haigh entitled *Analog IC design: the current-mode approach*, published by Peter Peregrinus Ltd, in 1990. In the present patent application, "current mirror" always refers to a non-inverting current mirror in which the output current variation has the same orientation as the input current variation. The polarity of such a current mirror may be positive or negative. For instance, FIG. 3 shows a positive current mirror (4), having an input terminal (5), an output terminal (6) and a common terminal (7), in which a positive current, denoted by I, flows into the input terminal (5) and a positive current, equal to k I, flows into the output terminal (6), where k is a positive current gain. For instance, FIG. 4 shows a negative current mirror (4), having an input terminal (5), an output terminal (6) and a common terminal (7), in which a positive current, denoted by I, flows out of the input terminal (5) and a positive current, equal to k I, flows out of the output terminal (6), where k is a positive current gain. A current mirror may have several output terminals.

The FIG. 5 shows an example of a schematic diagram of a negative current mirror (4), having an input terminal (5), an output terminal (6) and a common terminal (7), comprising two PNP bipolar transistors (41) (42). The FIG. 6 shows an example of a schematic diagram of a positive current mirror (4), having an input terminal (5), an output terminal (6) and a common terminal (7), comprising three NPN bipolar transistors (43) (44) (45). The FIG. 7 shows an example of a schematic diagram of a negative current mirror (4), having an input terminal (5), an output terminal (6) and a common terminal (7), comprising two p-channel insulated gate field-effect transistors (MOSFETs) operating in the saturation regime (41) (42). The FIG. 8 shows an example of a schematic diagram of a positive current mirror (4), having an input terminal (5), an output terminal (6) and a common terminal (7), comprising two n-channel MOSFETs operating in the saturation regime (41) (42).

The differential current-mode input circuits shown in the FIGS. 1 and 2 of the patent of the United States of America U.S. Pat. No. 7,471,110, entitled "Current mode interface for off-chip high speed communication", use independent current mirror input stages for each signal input terminal. Like the previous type of input circuit, this type of balanced-input current-sensing differential amplifier has a good linearity but it has the drawback of presenting a high common-mode input admittance.

SUMMARY OF THE INVENTION

The purpose of the invention is a balanced-input current-sensing differential amplifier which overcomes the above-mentioned limitations of known techniques.

According to the invention, a balanced-input current-sensing differential amplifier having a first signal input terminal and a second signal input terminal comprises:
  a first current mirror having an input terminal, a common terminal and at least one output terminal, the input terminal of said first current mirror being coupled to said first signal input terminal, said first current mirror being of a given polarity;
  a second current mirror having an input terminal, a common terminal and at least one output terminal, the input terminal of said second current mirror being coupled to said second signal input terminal, said second current mirror being of said given polarity;
  a third current mirror having an input terminal, a common terminal and at least one output terminal, one of the output terminals of said third current mirror being coupled to the common terminal of said first current mirror and to the common terminal of said second current mirror, said third current mirror being of said given polarity.

We see that, according to the invention, the first current mirror, the second current mirror and the third current mirror have the same polarity, so that they are either all positive or all negative.

The balanced-input current-sensing differential amplifier of the invention may be such that the current flowing into the input terminal of said third current mirror is substantially independent from a voltage applied to said first signal input terminal and from a voltage applied to said second signal input terminal. For instance, the current flowing into the input terminal of said third current mirror may be a constant current.

A balanced-input current-sensing differential amplifier of the invention may further comprise:
  a fourth current mirror having an input terminal, a common terminal and at least one output terminal, the input terminal of said fourth current mirror being coupled to said first signal input terminal, said fourth current mirror being of the polarity opposite to said given polarity;
  a fifth current mirror having an input terminal, a common terminal and at least one output terminal, the input terminal of said fifth current mirror being coupled to said second signal input terminal, said fifth current mirror being of the polarity opposite to said given polarity;
  a sixth current mirror having an input terminal, a common terminal and at least one output terminal, one of the output terminals of said sixth current mirror being coupled to the common terminal of said fourth current mirror and to the common terminal of said fifth current mirror, said sixth current mirror being of the polarity opposite to said given polarity.

We see that, according to the invention, if the first current mirror, the second current mirror and the third current mirror are positive current mirrors, then the fourth current mirror, the fifth current mirror and the sixth current mirror are negative current mirrors. We see that, conversely, if the first current mirror, the second current mirror and the third current mirror are negative current mirrors, then the fourth current mirror, the fifth current mirror and the sixth current mirror are positive current mirrors.

Additionally, this balanced-input current-sensing differential amplifier of the invention may be such that the current flowing into the input terminal of said sixth current mirror is substantially independent from a voltage applied to said first signal input terminal and from a voltage applied to said second signal input terminal. For instance, the current flowing into the input terminal of said sixth current mirror may be a constant current.

BRIEF DESCRIPTION OF THE DRAWINGS

Other advantages and characteristics will appear more clearly from the following description of particular embodiments of the invention, given by way of non-limiting examples, with reference to the accompanying drawings in which.

DETAILED DESCRIPTION OF SOME EMBODIMENTS

First Embodiment

Figure 1:
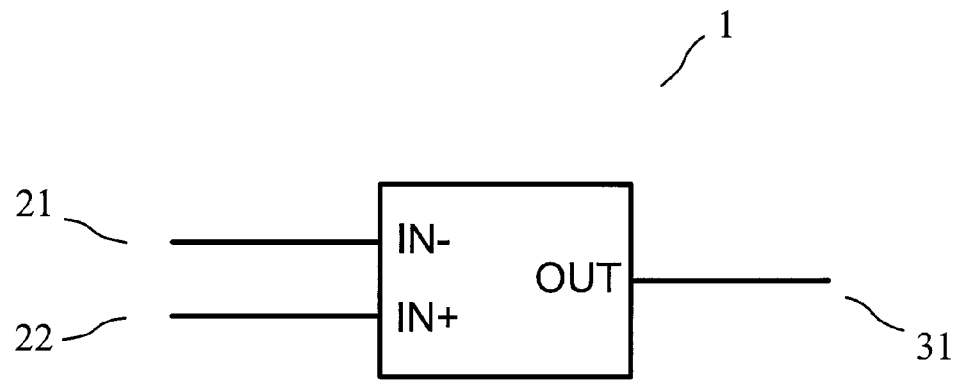
FIG. 1 shows a first example of balanced-input current-sensing differential amplifier, and has already been discussed in the section dedicated to the presentation of prior art.
Figure 2:
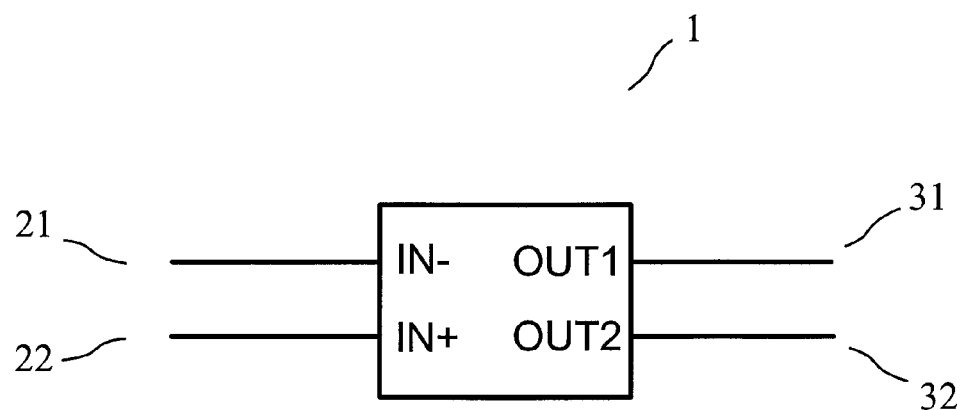
FIG. 2 shows a second example of balanced-input current-sensing differential amplifier, and has already been discussed in the section dedicated to the presentation of prior art.
Figure 3:
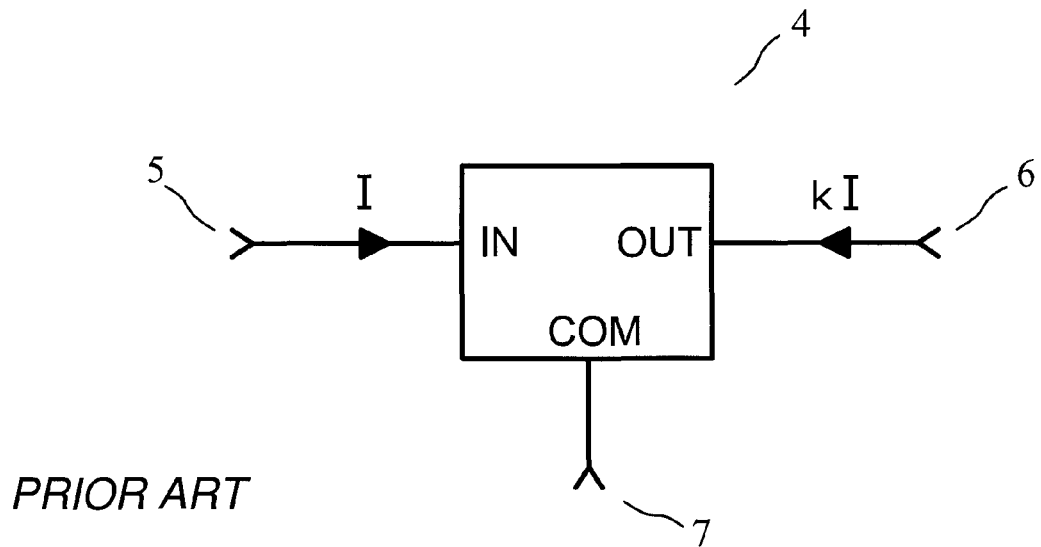
FIG. 3 shows a positive current mirror, and has already been discussed in the section dedicated to the presentation of prior art.
Figure 4:
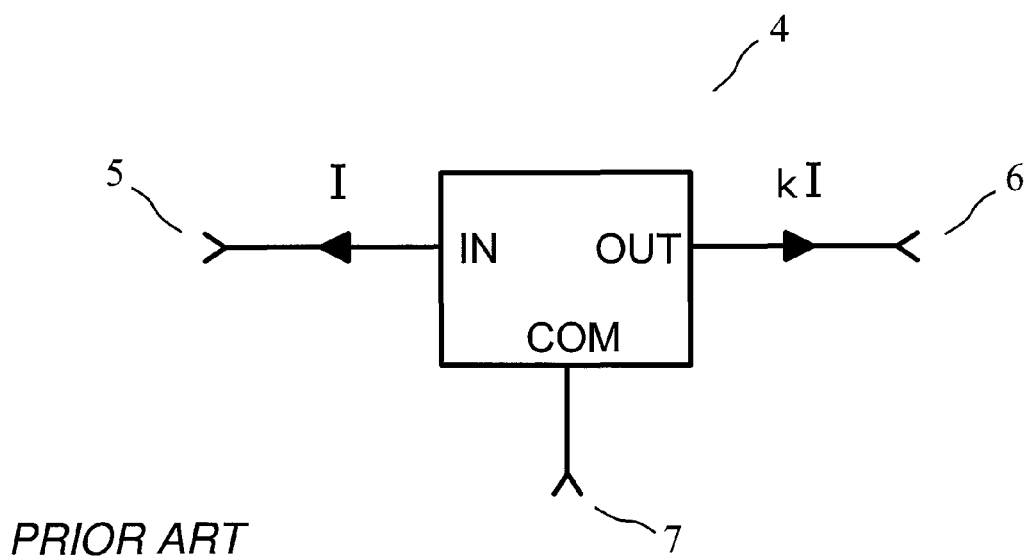
FIG. 4 shows a negative current mirror, and has already been discussed in the section dedicated to the presentation of prior art.
Figure 5:
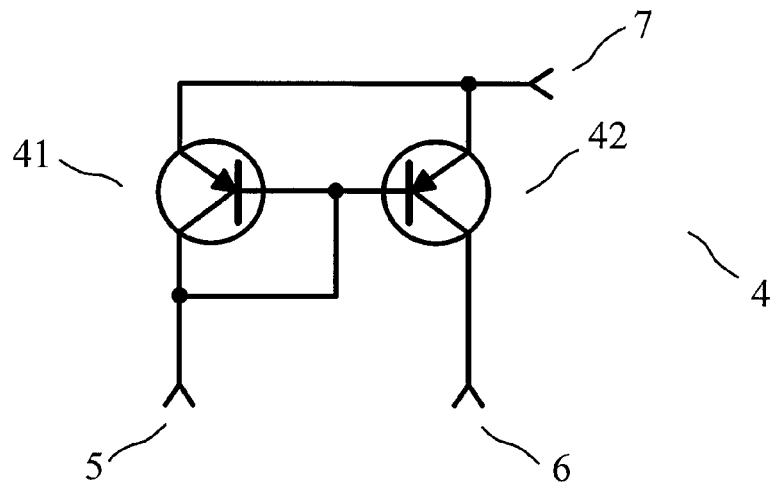
FIG. 5 shows a schematic diagram of a negative current mirror, and has already been discussed in the section dedicated to the presentation of prior art.
Figure 6:
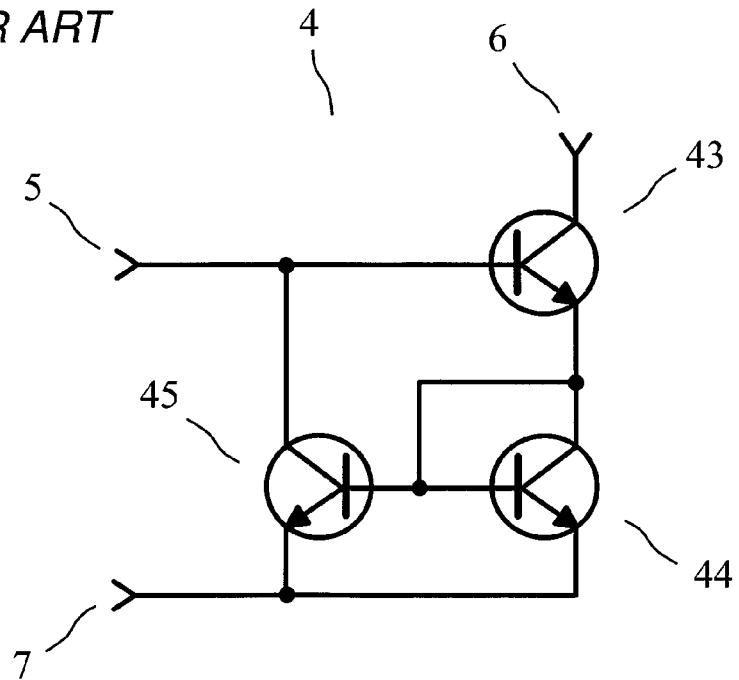
FIG. 6 shows a schematic diagram of a positive current mirror, and has already been discussed in the section dedicated to the presentation of prior art.
Figure 7:
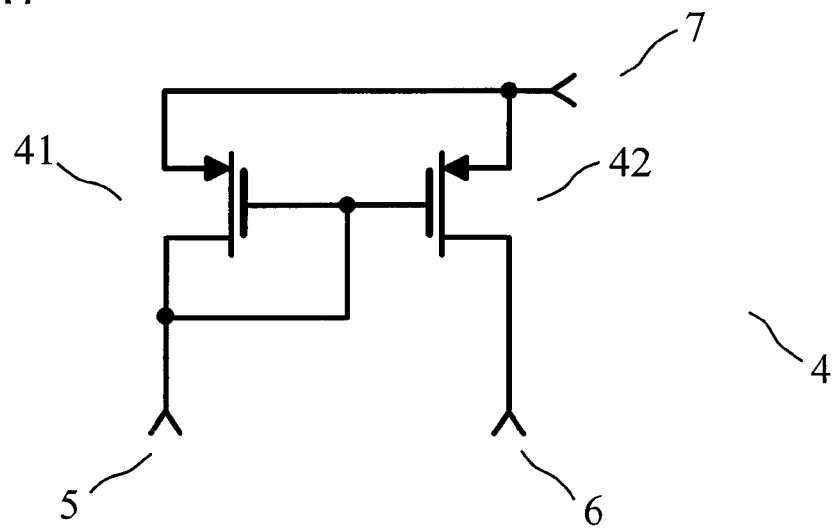
FIG. 7 shows a schematic diagram of a negative current mirror, and has already been discussed in the section dedicated to the presentation of prior art.
Figure 8:
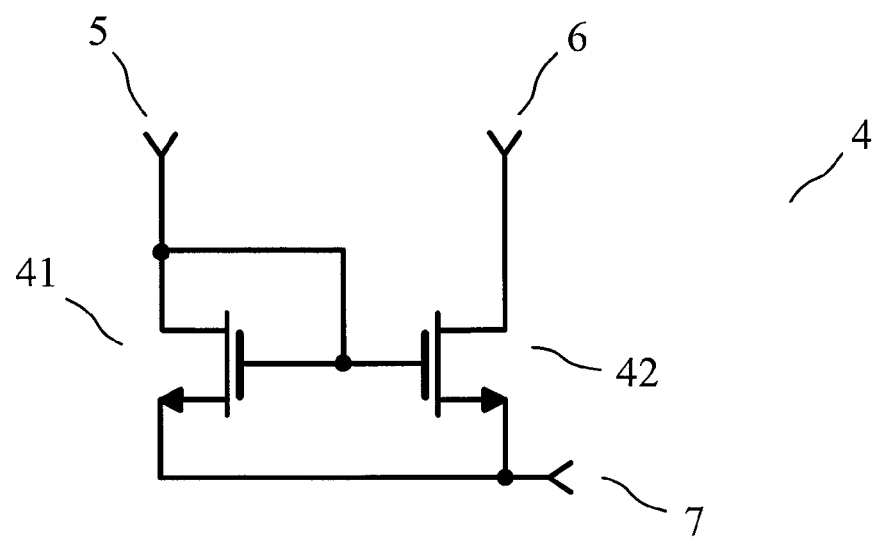
FIG. 8 shows a schematic diagram of a positive current mirror, and has already been discussed in the section dedicated to the presentation of prior art.
Figure 9:
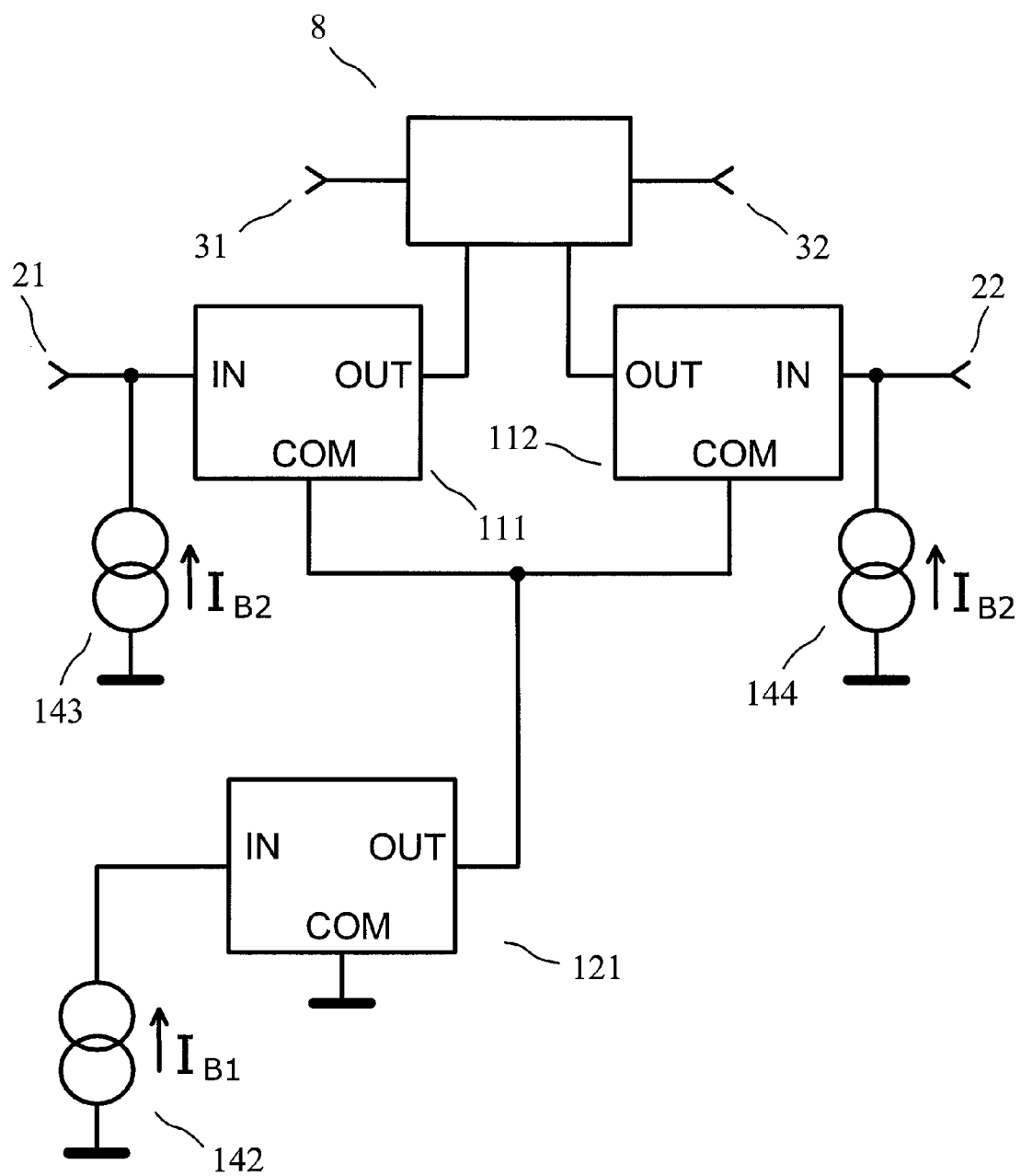
FIG. 9 shows the block diagram of a first embodiment of the invention.

As a first embodiment of a device of the invention, given by way of non-limiting example, we have represented in FIG. 9 the block diagram of a balanced-input current-sensing differential amplifier of the invention, having a first signal input terminal (21), a second signal input terminal (22), a first signal output terminal (31) and a second signal output terminal (32), the balanced-input current-sensing differential amplifier comprising:

a first current mirror (111) of a given polarity, said first current mirror having an input terminal, a common terminal and at least one output terminal, the input terminal of said first current mirror (111) being coupled to said first signal input terminal (21);

a second current mirror (112) of said given polarity, said second current mirror having an input terminal, a common terminal and at least one output terminal, the input terminal of said second current mirror (112) being coupled to said second signal input terminal (22);

a third current mirror (121) of said given polarity, said third current mirror having an input terminal, a common terminal and at least one output terminal, one of the output terminals of said third current mirror (121) being coupled to the common terminal of said first current mirror (111) and to the common terminal of said second current mirror (112).

The common terminal of said third current mirror (121) is grounded. The current flowing into the input terminal of said third current mirror (121) is a constant current, denoted by $I_{B1}$, delivered by a current source (142), so that the current flowing into the input terminal of said third current mirror (121) is independent from a voltage applied to said first signal input terminal (21) and from a voltage applied to said second signal input terminal (22). The first current mirror (111) and the second current mirror (112) are substantially identical and have a positive current gain, denoted by k. The third current mirror (121) has a positive current gain, denoted by K. The input terminals of the first current mirror (111) and of the second current mirror (112) are biased by two current sources (143) (144) each providing a constant current $I_{B2}$ such that $$KI_{B1}=2(k+1)I_{B2} \tag{6}$$

The specialist understands that the current sources shown in FIG. 9 and in the next figures are ideal circuit elements which may be realized with real components, for instance using current mirrors.

An output circuit (8) is connected to the output terminals of the first current mirror (111) and of the second current mirror (112) and to the signal output terminals (31) (32). The output circuit (8) is such that, in the intended frequency range of operation:

the voltage delivered by the first signal output terminal (31) is substantially equal to the sum of a constant voltage and of a first variable voltage proportional to the difference between the current flowing into the first signal input terminal (21) and the current flowing into the second signal input terminal (22);

the voltage delivered by the second signal output terminal (32) is substantially equal to the sum of said constant voltage and of a second variable voltage equal to the opposite of said first variable voltage.

The power supply terminal(s) needed to power feed the balanced-input current-sensing differential amplifier is (are) not shown in FIG. 9.

Second Embodiment

Best Mode

Figure 10:
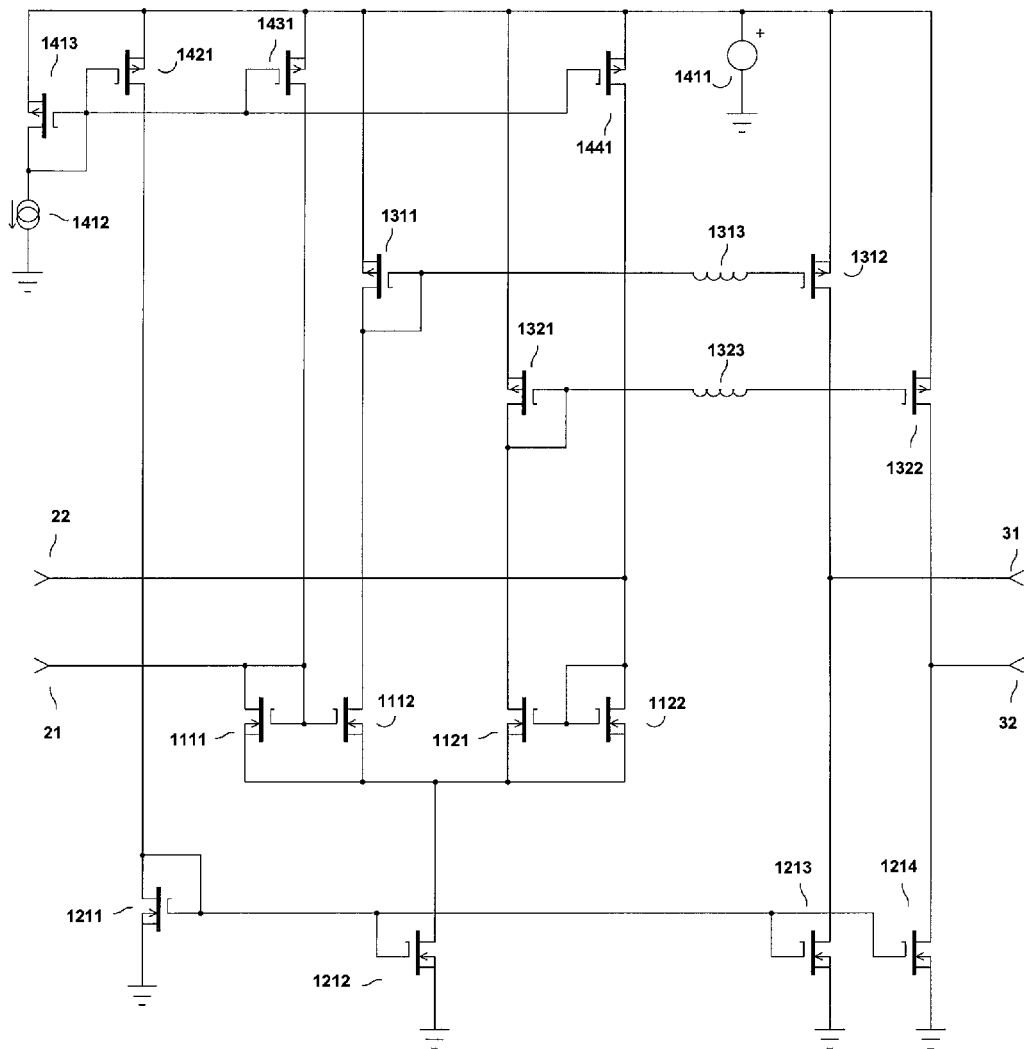
FIG. 10 shows the schematic diagram of a second embodiment of the invention.

As a second embodiment of a device of the invention, given by way of non-limiting example and best mode of carrying out the invention, we have represented in FIG. 10 the schematic diagram of a balanced-input current-sensing differential amplifier of the invention, having a first signal input terminal (21), a second signal input terminal (22), a first signal output terminal (31) and a second signal output terminal (32), the balanced-input current-sensing differential amplifier comprising:

a first positive current mirror consisting of two n-channel MOSFETs (1111) (1112), said first positive current mirror having an input terminal, a common terminal and an output terminal, the input terminal of said first positive current mirror being coupled to said first signal input terminal (21);

a second positive current mirror consisting of two n-channel MOSFETs (1121) (1122), said second positive current mirror having an input terminal, a common terminal and an output terminal, the input terminal of said second positive current mirror being coupled to said second signal input terminal (22);

a third positive current mirror consisting of four n-channel MOSFETs (1211) (1212) (1213) (1214), said third positive current mirror having an input terminal, a common terminal and three output terminals, one of the output terminals of said third positive current mirror being coupled to the common terminal of said first positive current mirror and to the common terminal of said second positive current mirror.

Figure 11:
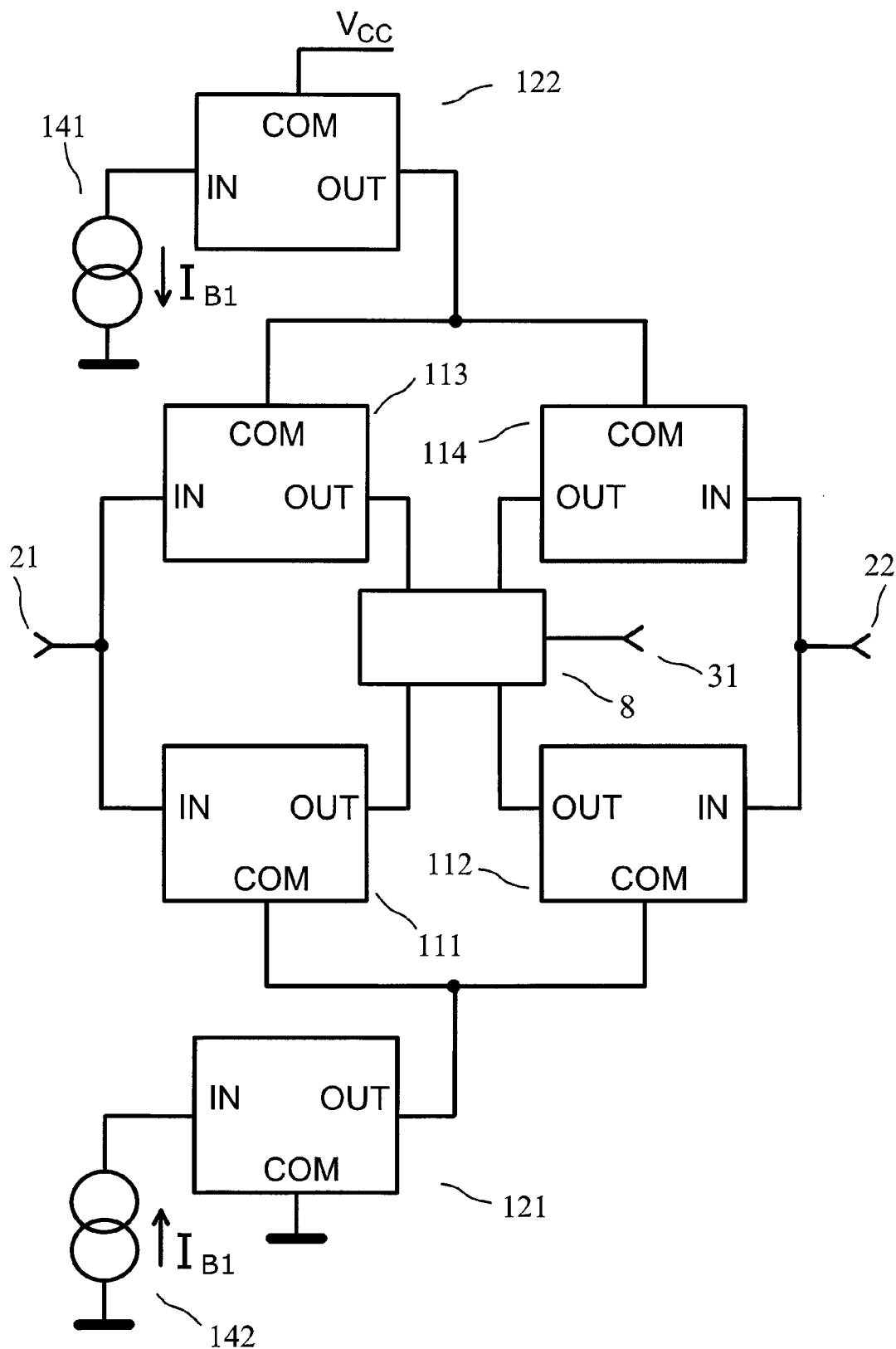
FIG. 11 shows the block diagram of a third embodiment of the invention.
Figure 12:
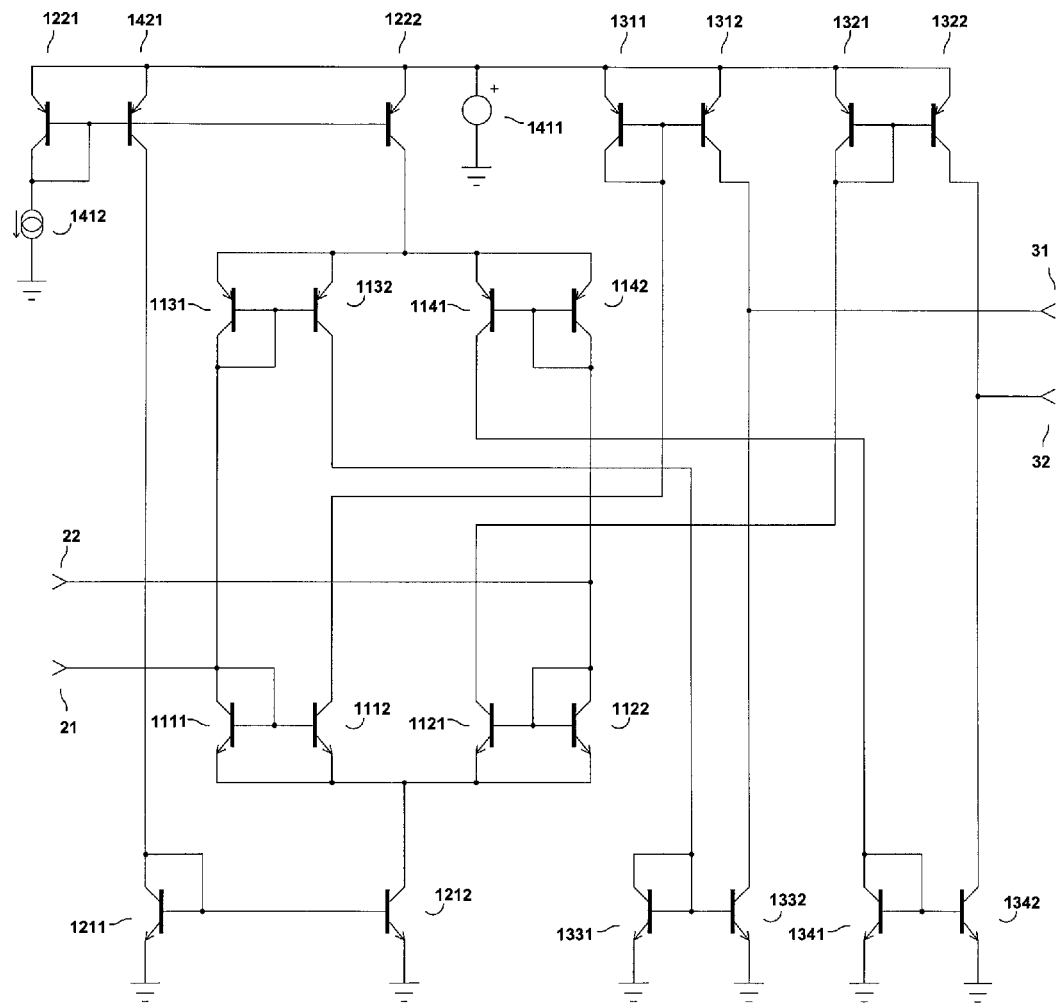
FIG. 12 shows the schematic diagram of a fourth embodiment of the invention.

The common terminal of said third positive current mirror is grounded, the ground symbol used in FIG. 10 and in FIG. 12 having exactly the same meaning as the other ground symbol used in FIG. 9 and in FIG. 11. A voltage source (1411) power feeds the balanced-input current-sensing differential amplifier shown in FIG. 10. A current source (1412) delivers a constant current to the input of a negative current mirror having three output terminals, consisting of four p-channel MOSFETs (1413) (1421) (1431) (1441). This negative current mirror is used for biasing the input terminal of said first positive current mirror with a constant current $I_{B2}$, the input terminal of said second positive current mirror with the same constant current $I_{B2}$, and the input terminal of said third positive current mirror with a constant current $I_{B1}$. The current flowing into the input terminal of said third positive current mirror is therefore substantially independent from a voltage applied to said first signal input terminal (21) and from a voltage applied to said second signal input terminal (22). The first positive current mirror and the second positive current mirror are substantially identical and have a positive current gain, denoted by k. The third positive current mirror has a positive current gain, denoted by K. The equation (6) is satisfied.

An output circuit comprises:

a first output current mirror consisting of two p-channel MOSFETs (1311) (1312) and a peaking inductor (1313);

a second output current mirror consisting of two p-channel MOSFETs (1321) (1322) and a peaking inductor (1323).

The specialist understands that the circuit elements shown in FIG. 10 may be proportioned such that, in the intended frequency range of operation:
the current delivered by the first signal output terminal (31) is substantially proportional to the difference between the current flowing into the first signal input terminal (21) and the current flowing into the second signal input terminal (22);
the current delivered by the second signal output terminal (32) is substantially the opposite of the current delivered by the first signal output terminal (31).

The balanced-input current-sensing differential amplifier shown in FIG. 10 provides a bandwidth of 5 GHz, it presents a low differential-mode input impedance, of about 430Ω in the frequency range dc to 5 GHz, and it presents a low common-mode input admittance. This balanced-input current-sensing differential amplifier does not use a voltage-sensing differential amplifier for sensing a small voltage across a resistor. The specialist understands that the "output current versus differential-mode input current" characteristic of this balanced-input current-sensing differential amplifier is well controlled (it depends neither on manufacturing process variations nor on temperature) and has a good linearity. The specialist also understands that the "differential-mode input voltage versus differential-mode input current" characteristic of this balanced-input current-sensing differential amplifier has a good linearity, and may easily correspond to a differential-mode input impedance in the range 100Ω to 2000Ω.

Third Embodiment

As a third embodiment of a device of the invention, given by way of non-limiting example, we have represented in FIG. 11 the block diagram of a balanced-input current-sensing differential amplifier of the invention having a first signal input terminal (21), a second signal input terminal (22) and a signal output terminal (31), the balanced-input current-sensing differential amplifier comprising:

a first positive current mirror (111) having an input terminal, a common terminal and at least one output terminal, the input terminal of said first positive current mirror (111) being coupled to said first signal input terminal (21);

a second positive current mirror (112) having an input terminal, a common terminal and at least one output terminal, the input terminal of said second positive current mirror (112) being coupled to said second signal input terminal (22);

a third positive current mirror (121) having an input terminal, a common terminal and at least one output terminal, one of the output terminals of said third positive current mirror (121) being coupled to the common terminal of said first positive current mirror (111) and to the common terminal of said second positive current mirror (112);

a first negative current mirror (113) having an input terminal, a common terminal and at least one output terminal, the input terminal of said first negative current mirror (113) being coupled to said first signal input terminal (21);

a second negative current mirror (114) having an input terminal, a common terminal and at least one output terminal, the input terminal of said second negative current mirror (114) being coupled to said second signal input terminal (22);

a third negative current mirror (122) having an input terminal, a common terminal and at least one output terminal, one of the output terminals of said third negative current mirror (122) being coupled to the common terminal of said first negative current mirror (113) and to the common terminal of said second negative current mirror (114).

The common terminal of said third positive current mirror (121) is grounded. The common terminal of said third negative current mirror (122) is connected to a power supply node. The current flowing into the input terminal of said third positive current mirror (121) is delivered by a current source (142) providing a constant current $I_{B1}$, and the current flowing out of the input terminal of said third negative current mirror (122) is delivered by a current source (141) providing the same constant current $I_{B1}$. Thus, the current flowing into the input terminal of said third positive current mirror (121) and the current flowing out of the input terminal of said third negative current mirror (122) are independent from a voltage applied to said first signal input terminal (21) and from a voltage applied to said second signal input terminal (22). The first positive current mirror (111) and the second positive current mirror (112) are substantially identical and have a positive current gain, denoted by k. The first negative current mirror (113) and the second negative current mirror (114) are substantially identical and have a positive current gain substantially equal to k.

An output circuit (8) is connected to the output terminals of the first positive current mirror (111), of the second positive current mirror (112), of the first negative current mirror (113) and of the second negative current mirror (114), and to the signal output terminal (31). The output circuit (8) is such that, in the intended frequency range of operation, the voltage delivered by the signal output terminal (31) is substantially equal to the sum of a constant voltage and of a variable voltage proportional to the difference between the current flowing into the first signal input terminal (21) and the current flowing into the second signal input terminal (22).

The power supply terminal(s) needed to power feed the output circuit (8) is (are) not shown in FIG. 11.

Fourth Embodiment

As a fourth embodiment of a device of the invention, given by way of non-limiting example, we have represented in FIG.

12 the schematic diagram of a balanced-input current-sensing differential amplifier of the invention having a first signal input terminal (21), a second signal input terminal (22), a first signal output terminal (31) and a second signal output terminal (32), the balanced-input current-sensing differential amplifier comprising:

a first positive current mirror consisting of two NPN bipolar transistors (1111) (1112), said first positive current mirror having an input terminal, a common terminal and an output terminal, the input terminal of said first positive current mirror being coupled to said first signal input terminal (21);

a second positive current mirror consisting of two NPN bipolar transistors (1121) (1122), said second positive current mirror having an input terminal, a common terminal and an output terminal, the input terminal of said second positive current mirror being coupled to said second signal input terminal (22);

a third positive current mirror consisting of two NPN bipolar transistors (1211) (1212), said third positive current mirror having an input terminal, a common terminal and an output terminal, the output terminal of said third positive current mirror being coupled to the common terminal of said first positive current mirror and to the common terminal of said second positive current mirror;

a first negative current mirror consisting of two PNP bipolar transistors (1131) (1132), said first negative current mirror having an input terminal, a common terminal and an output terminal, the input terminal of said first negative current mirror being coupled to said first signal input terminal (21);

a second negative current mirror consisting of two PNP bipolar transistors (1141) (1142), said second negative current mirror having an input terminal, a common terminal and an output terminal, the input terminal of said second negative current mirror being coupled to said second signal input terminal (22);

a third negative current mirror consisting of three PNP bipolar transistors (1221) (1421) (1222), said third negative current mirror having an input terminal, a common terminal and two output terminals, one of the output terminals of said third negative current mirror being coupled to the common terminal of said first negative current mirror and to the common terminal of said second negative current mirror.

A voltage source (1411) power feeds the balanced-input current-sensing differential amplifier shown in FIG. 12. The common terminal of said third positive current mirror is grounded. The common terminal of said third negative current mirror is connected to a power supply node. A current source (1412) delivers a constant current to the input of said third negative current mirror. The third negative current mirror delivers a constant current to the input terminal of said third positive current mirror. Thus, the current flowing into the input terminal of said third positive current mirror and the current flowing out of the input terminal of said third negative current mirror are substantially independent from a voltage applied to said first signal input terminal (21) and from a voltage applied to said second signal input terminal (22). The first positive current mirror, the second positive current mirror, the first negative current mirror and the second negative current mirror have substantially the same current gain.

An output circuit comprises:
a first output current mirror made of two PNP bipolar transistors (1311) (1312);
a second output current mirror made of two PNP bipolar transistors (1321) (1322);
a third output current mirror made of two NPN bipolar transistors (1331) (1332);
a fourth output current mirror made of two NPN bipolar transistors (1341) (1342).

The specialist understands that the circuit elements shown in FIG. 12 may be proportioned such that, in the intended frequency range of operation:
the current delivered by the first signal output terminal (31) is substantially proportional to the difference between the current flowing into the first signal input terminal (21) and the current flowing into the second signal input terminal (22);
the current delivered by the second signal output terminal (32) is substantially the opposite of the current delivered by the first signal output terminal (31).

The balanced-input current-sensing differential amplifier shown in FIG. 12 provides a bandwidth of 10 GHz, it presents a low differential-mode input impedance, of about 50Ω in the frequency range dc to 10 GHz, and it presents a low common-mode input admittance. This balanced-input current-sensing differential amplifier does not use a voltage-sensing differential amplifier for sensing a small voltage across a resistor. The specialist understands that the "output current versus differential-mode input current" characteristic of this balanced-input current-sensing differential amplifier is well controlled and has a good linearity. The specialist also understands that the "differential-mode input voltage versus differential-mode input current" characteristic of this balanced-input current-sensing differential amplifier has a good linearity, and may easily correspond to a differential-mode input impedance in the range 10Ω to 250Ω, which can be adjusted with the current delivered by the current source (1412). Thus, the differential-mode input impedance of a balanced-input current-sensing differential amplifier of the invention can be adjusted by electrical means.

INDICATIONS ON INDUSTRIAL APPLICATIONS

The specialist understands that a balanced-input current-sensing differential amplifier of the invention may be used as a part of a line receiver for differential electrical links used for transmitting analog or digital signals, typically as the input circuit of the line receiver for differential electrical links. In this case, the signal input terminals of the balanced-input current-sensing differential amplifier of the invention are coupled to the transmission conductors of the balanced interconnection.

In the context of high-speed links, the balanced-input current-sensing differential amplifier of the invention has the following advantages:
it does not use a voltage-sensing differential amplifier for sensing a small voltage across a resistor;
it presents a low common-mode input admittance;
the "output variable versus differential-mode input current" characteristic is well controlled and may have a good linearity, this property being very important for high-performance multilevel digital signaling and for simultaneous bidirectional signaling;
the "differential-mode input voltage versus differential-mode input current" characteristic has a good linearity and it may provide a differential-mode input impedance suitable for canceling reflections in a differential link, thereby eliminating the need for a termination;
the differential-mode input impedance may be adjustable by electrical means.

The invention claimed is:

1. A balanced-input current-sensing differential amplifier having a first signal input terminal and a second signal input terminal, the balanced-input current-sensing differential amplifier comprising:

a first current mirror having an input terminal, a common terminal and at least one output terminal, the input terminal of the first current mirror being coupled to the first signal input terminal, the first current mirror being such that a current flowing through said at least one output terminal of the first current mirror is substantially linearly proportional to a current flowing through said input terminal of the first current mirror, the first current mirror being of a given polarity;

a second current mirror having an input terminal, a common terminal and at least one output terminal, the input terminal of the second current mirror being coupled to the second signal input terminal, the second current mirror being such that a current flowing through said at least one output terminal of the second current mirror is substantially linearly proportional to a current flowing through said input terminal of the second current mirror, the second current mirror being of the given polarity; and a third current mirror having an input terminal, a common terminal and at least one output terminal, said at least one output terminal of the third current mirror being coupled to the common terminal of the first current mirror and to the common terminal of the second current mirror, the third current mirror being such that a current flowing through said at least one output terminal of the third current mirror is substantially linearly proportional to a current flowing through said input terminal of the third current mirror, the third current mirror being of the given polarity.

2. The balanced-input current-sensing differential amplifier of claim 1, wherein the current flowing into the input terminal of the third current mirror is substantially independent from a voltage applied to the first signal input terminal and from a voltage applied to the second signal input terminal.

3. The balanced-input current-sensing differential amplifier of claim 1, wherein the current flowing into the input terminal of the third current mirror is a constant current.

4. The balanced-input current-sensing differential amplifier of claim 1, wherein the first current mirror and the second current mirror are substantially identical.

5. The balanced-input current-sensing differential amplifier of claim 1, wherein the differential-mode input impedance of the balanced-input current-sensing differential amplifier can be adjusted by electrical means.

6. The balanced-input current-sensing differential amplifier of claim 1, wherein the balanced-input current-sensing differential amplifier constitutes a part of a line receiver for differential electrical links.

7. A balanced-input current-sensing differential amplifier having a first signal input terminal and a second signal input terminal, the balanced-input current-sensing differential amplifier comprising:

a first current mirror having an input terminal, a common terminal and at least one output terminal, the input terminal of the first current mirror being coupled to the first signal input terminal, the first current mirror being of a given polarity;

a second current mirror having an input terminal, a common terminal and at least one output terminal, the input terminal of the second current mirror being coupled to the second signal input terminal, the second current mirror being of the given polarity;

a third current mirror having an input terminal, a common terminal and at least one output terminal, said at least one output terminal of the third current mirror being coupled to the common terminal of the first current mirror and to the common terminal of the second current mirror, the third current mirror being of the given polarity;

a fourth current mirror having an input terminal, a common terminal and at least one output terminal, the input terminal of the fourth current mirror being coupled to the first signal input terminal, the fourth current mirror being of the polarity opposite to the given polarity;

a fifth current mirror having an input terminal, a common terminal and at least one output terminal, the input terminal of the fifth current mirror being coupled to the second signal input terminal, the fifth current mirror being of the polarity opposite to the given polarity; and a sixth current mirror having an input terminal, a common terminal and at least one output terminal, said at least one output terminal of the sixth current mirror being coupled to the common terminal of the fourth current mirror and to the common terminal of the fifth current mirror, the sixth current mirror being of the polarity opposite to the given polarity.

8. The balanced-input current-sensing differential amplifier of claim 7, wherein:

the current flowing into the input terminal of the third current mirror is substantially independent from a voltage applied to the first signal input terminal and from a voltage applied to the second signal input terminal; and the current flowing into the input terminal of the sixth current mirror is substantially independent from a voltage applied to the first signal input terminal and from a voltage applied to the second signal input terminal.

9. The balanced-input current-sensing differential amplifier of claim 7, wherein the current flowing into the input terminal of the third current mirror is a constant current; and the current flowing into the input terminal of the sixth current mirror is a constant current.

10. The balanced-input current-sensing differential amplifier of claim 7, wherein the first current mirror and the second current mirror are substantially identical and have a positive current gain, denoted by k, and wherein the fourth current mirror and the fifth current mirror are substantially identical and have a positive current gain substantially equal to k.

11. The balanced-input current-sensing differential amplifier of claim 7, wherein the differential-mode input impedance of the balanced-input current-sensing differential amplifier can be adjusted by electrical means.

12. The balanced-input current-sensing differential amplifier of claim 7, wherein the balanced-input current-sensing differential amplifier constitutes a part of a line receiver for differential electrical links.

* * * * *